United States Patent [19]

Meissner et al.

[11] Patent Number: 4,801,885
[45] Date of Patent: Jan. 31, 1989

[54] NUCLEAR MAGNETIC RESONANCE APPARATUS FOR THE IDENTIFICATION OF SPECTRA OR IMAGES OF AN EXAMINATION SUBJECT

[75] Inventors: Ralph Meissner, Erlangen; Helmut Kess, Deggendorf, both of Fed. Rep. of Germany

[73] Assignee: Siemens Aktiengesellshaft, Berlin and Munich, Fed. Rep. of Germany

[21] Appl. No.: 97,138

[22] Filed: Sep. 16, 1987

[30] Foreign Application Priority Data

Sep. 22, 1986 [DE] Fed. Rep. of Germany ....... 3632137

[51] Int. Cl.[4] ............................................ G01R 33/20
[52] U.S. Cl. ..................................... 324/318; 324/322
[58] Field of Search ................ 324/318, 322, 311, 313, 324/314

[56] References Cited

U.S. PATENT DOCUMENTS 4,728,896 3/1988 Bendall et al. ........................ 324/318

FOREIGN PATENT DOCUMENTS 0164164 12/1985 European Pat. Off. .
0170514 2/1986 European Pat. Off. .
3427666 2/1986 Fed. Rep. of Germany .
59-70950 4/1984 Japan .
2153086 8/1985 United Kingdom .
2161940 1/1986 United Kingdom .

OTHER PUBLICATIONS

"Improved Surface Coil Imaging in MR: Decoupling of the Excitation and Receiver Coils[1], " Boskamp, Radiology, Nov. 1985, pp. 449–452.

Primary Examiner—Stewart J. Levy
Assistant Examiner—Louis M. Arana

[57] ABSTRACT

A nuclear magnetic resonance apparatus which is capable of identifying either spectra or images of an examination subject uses a body resonator, such as a whole-body antenna, for transmitting radio frequency signals at a wave length $\lambda$ to induce nuclear magnetic resonance phenomena in the examination subject, and a surface coil for receiving the resulting nuclear magnetic resonance signals. For decoupling the body resonator from the surface coil, a $\lambda/4$ line is connected to the surface coil. A terminating end of the $\lambda/4$ line is short-circuited during emission of radio frequency pulses by the body resonator, and is opened during reception of nuclear magnetic resonance signals using the surface coil. An effective detuning of the body resonator is thus achieved during the reception event, and at the same time the transmission event is minimally influenced.

12 Claims, 2 Drawing Sheets

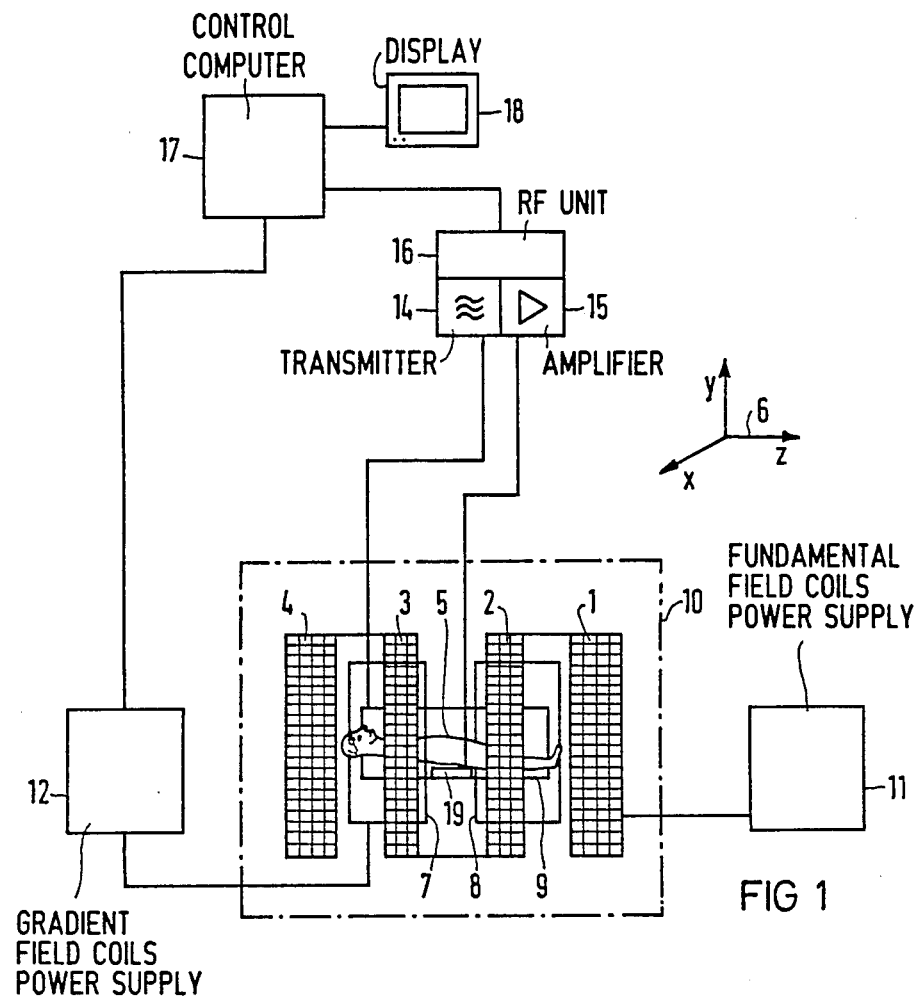
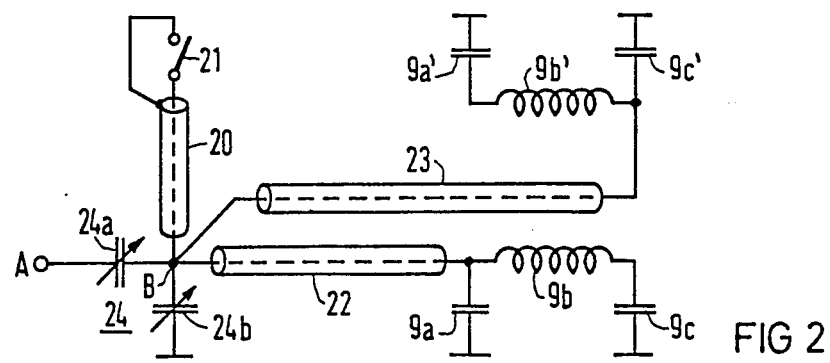

NUCLEAR MAGNETIC RESONANCE APPARATUS FOR THE IDENTIFICATION OF SPECTRA OR IMAGES OF AN EXAMINATION SUBJECT

BACKGROUND OF THE INVENTION

1. Field of the Invention

The present invention is directed to a nuclear magnetic resonance apparatus for identifying either spectra or images of an examination subject. The apparatus is of the type using a whole-body antenna to irradiate the examination subject with a sequence of radio-frequency pulses, and a surface coil for acquiring the nuclear magnetic resonance signals emitted by the examination subject. The whole-body antenna and the surface coil are decoupled from each other.

2. Description of the Prior Art

Surface coils are often utilized for the examination of individual body regions of an examination subject using nuclear magnetic resonance principles. Such surface coils improve the spatial resolution in the sensitivity region of the surface coil, due to a rise in the signal-to-noise ratio. Transmission is preferably undertaken using a whole-body antenna covering the entire examination volume in order to generate an optimally homogenous signal in the region of the surface coil with respect to the radio-frequency excitation. The signals emitted by the resonated nuclei are then received with the surface coil, at which time the homogeneity plays only a subordinate role.

Because the whole-body antenna and the surface coil are tuned to the same resonant frequency, these elements must be mutually decoupled to prevent one element from influencing the other. When the whole-body antenna generates a linearly polarized field, the field of the surface coil can be aligned perpendicularly to the field of the whole-body antenna. The physical position of the surface coil, however, is fixed relative to the whole-body antenna and the surface coil cannot be freely oriented, for example, for adaptation to a particular anotomical environment. Given a circularly polarized whole-body antenna, a decoupling of the surface coil and the whole-body antenna in this manner is not possible.

An article by Boskamp in Radiology, Vol. 157, No. 2, pages 449–452 discloses detuning of the surface coil by the use of tuning diodes (Varicaps) while the whole-body antenna is in operation. During the operation of the surface coil, the whole-body antenna is shorted with the assistance of a diode bridge consisting of P-I-N diodes.

In this known detuning method, however, there is a risk that the measures provided for decoupling will influence the whole-body antenna during the transmission or reception mode, and there is the further risk that the decoupling measures will deteriorate the transient circuit quality.

Moreover, it is not sufficient to achieve decoupling of the surface coil simply by tuning toward higher frequencies. A higher voltage, which can destroy the tuning diodes, arises at the high resonant impedance due to the radio-frequency coupling-in of the whole-body antenna.

A circuit arrangement for decoupling the individual coils of a multiple coil measuring head or probe in a nuclear magnetic resonance apparatus is disclosed in German OS No. 34 27 666. In this circuit, a transmission coil is connected to a transmitter via a λ/2 line and via two parallel branches of diodes, each branch consisting of two diodes in series and the branches being connected with the polarities of the diodes therein in opposite directions. The reception coil is connected via a λ/4 line to a receiver which has an input with an anti-parallel circuit of two diodes connected in parallel therewith.

During transmission, the reception coil generates a high output voltage which exceeds the thresholds of the diode connected in parallel with the receiver input, so that these diodes become conductive and the voltage across the circuit is limited to the threshold voltage.

During reception, the diodes connected in parallel with the receiver input are non-transmissive because of the significantly weaker voltages. The signals registered during the reception mode of the transmission coil similarly do not reach the thresholds of the diodes preceding the transmitter.

Thus, in this circuit as well, a complete decoupling is not guaranteed on the basis of the diode threshold voltages.

SUMMARY OF THE INVENTION

It is an object of the present invention to provide a decoupling means for the transmitting and receiving elements in a nuclear magnetic resonance wherein the influence on the associated resonant circuit remains slight outside of the detuning phases, particularly during operation of the transmitting element, so that no current can flow in the receiving element during this time.

The above object is achieved in accordance with the principles of the present invention in a nuclear magnetic resonance apparatus wherein a λ/4 line is connected to the transmitting element (which is a whole-body antenna) via a coaxial line. The end of the λ/4 line is shorted during the generation of radio-frequency pulses using the whole-body antenna, and is opened during reception of nuclear magnetic resonance signals using the reception element (which is a surface coil). The coaxial line transforms the high impedance of the whole-body antenna to a lower level. The λ/4 line provides a simple and inexpensive means for detuning the allocated resonant circuit, which has negligible influence on the resonant circuit in its closed state.

Due to the transformation of the high impedance of the whole-body antenna to a lower level, the influence of the closed λ/4 line on the inherent quality of the allocated resonant circuit is even further reduced. This has the additional advantage that the voltage at the whole-body antenna is also transformed downwardly, so that the resulting currents are easier to manipulate than those which would have been generated by the higher voltages.

The short-circuiting of the λ/4 line can be accomplished using at least one P-I-N diode connected to the end thereof in a simple embodiment.

DESCRIPTION OF THE DRAWINGS

FIG. 1 is a schematic block diagram of a nuclear magnetic resonance apparatus constructed in accordance with the principles of the present invention.

FIG. 2 is a schematic diagram of a first embodiment of a decoupling means for the apparatus of FIG. 1.

DESCRIPTION OF THE PREFERRED EMBODIMENTS

Figure 3:
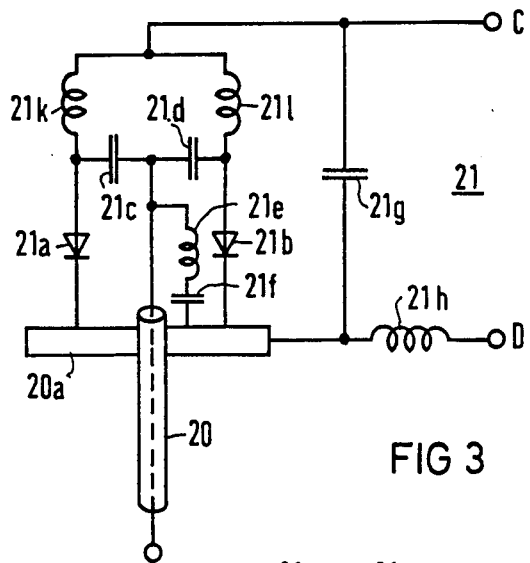
FIG. 3 is a schematic diagram of the switch used in the embodiment of FIG. 2.

The basic structure of a nuclear magnetic resonance apparatus of the type in which the principles of the present invention may be employed is schematically shown in FIG. 1. The apparatus of FIG. 1 is for producing tomograms of an examination subject, however, the principles of the present invention may equally be employed in nuclear magnetic resonance devices for generating spectroscopic data.

The apparatus includes coils 1, 2, 3 and 4 which generate a fundamental magnetic field in which the body 5 of a patient to be examined is disposed, such as for medical diagnostics. Gradient coils are provided for each of the directions x, y and z, referenced by the coordinate axes 6. Each set of gradient coils generates an independent magnetic field gradient perpendicular to the other two gradient fields. For clarity, only gradient coils 7 and 8 are shown in FIG. 1. These coils 7 and 8, in combination with a pair (not shown) of identical gradient coils on the opposite side of the patient 5, generate the x-gradient. Identical y-gradient coils (not shown) are disposed above and below and parallel to the body 5; identical z-gradient coils (not shown) are disposed at the head and feet of the body 5, oriented transversely relative to the longitudinal axis of the body 5.

The apparatus also includes a body resonator 9, such as a whole-body antenna, for generating the nuclear magnetic resonance signals in the body 5. A surface coil 19 is provided for acquiring the resulting nuclear magnetic resonance signals.

The coils bounded by the dot-dash line 10 represent the actual examination instrument in which the patient is disposed. The coils are operated from an electrical arrangement which includes a power supply 11 for the fundamental field coils 1 through 4, and a gradient field power supply 12, to which the gradient coils 7 and 8 (and the other gradient coils which are not shown) are connected. A radio-frequency unit 16 is provided for signal generation and acquisition. The unit 16 includes a radio-frequency transmitter 14 controlled by a process control computer 17, which is connected to the body resonator 9. The surface coil 19 is coupled to the process control computer 17 via a signal amplifier 15. A display 18 is connected to the output of the control computer 17 for providing an image of the region of interest of the body 5.

An exemplary embodiment of a decoupling means for the body resonator 9 is shown in FIG. 2. The embodiment of FIG. 2 may, for example, be applied to a body resonator as disclosed in German OS No. 31 33 432. In the simplest case, the body resonator consists of a pair of rods in which current respectively flows in opposite directions. In FIG. 2, these rods are indicated by their equivalent circuit diagram, each rod being the equivalent of two capacitors and an inductance. Thus capacitors 9a and 9c and inductance 9b represent one rod, and capacitors 9a' and 9c' and inductance 9b' represent the other rod. The rods are connected to a node B of a matching circuit 24 via respective coaxial lines 22 and 23. The coaxial lines 22 and 23 must have the same electrical length, so that the phase relationship between the two rods is preserved.

The matching circuit 24 includes a tunable series capacitor 24a and a parallel capacitor 24b, which is also tunable. The feed cable, connected at point A, can thus be matched to the body resonator 9 using the capacitors 24a and 24b.

The λ/4 line 20, a coaxial line in this case, is connected to the node B to which the coaxial lines 22 and 23 are connected. The end of the λ/4 line 20 can be short-circuited by a switch 21 connected between the inner conductor and the jacket conductor.

The switch 21 is closed when the body resonator 9 is in the transmission mode. The λ/4 line 20 is thus shorted and thus has only an extremely slight influence on the resonant circuit of the body resonator 9. It is thus especially advantageous that the λ/4 line 20 is not directly connected to the body resonator 9, but rather to the ends of the coaxial lines 22 and 23, which transform the high impedance of the body resonator 9 down to a lower level. It is also advantageous that the switch 21 is in this embodiment not any longer charged with higher voltages, but instead is charged with correspondingly higher currents via the λ/4 line 20. For radio-frequency switches, however, higher currents are more easily handled than are higher voltages. An electrical length of the coaxial lines 22 and 23 of 3 λ/8 is particularly advantageous for the impedance transformation.

An exemplary embodiment of the switch 21 is shown in FIG. 3. The jacket conductor of the λ/4 line 20 is connected to a copper block 20a, to which the cathodes of two P-I-N diodes 21a and 21b are connected. The anodes of the P-I-N diodes are each connected to the inner conductor of the λ/4 line 20 via respective capacitors 21c and 21d. The anodes of the diodes 21a and 21b are also connected to a terminal C to which a control dc voltage is supplied. The anodes are connected to the terminal C via respective inductances 21k and 21l. A further terminal D for the control dc voltage is connected to the copper block 20a through another inductance 21h. The terminal C is also connected to the junction of the copper block 20a and the inductance 21h through a capacitor 21g. A series resonant circuit is also provided consisting of an inductance 21e and a capacitor 21f connected between the inner conductor of the λ/4 line 20 and the copper block 20a. An optimization of the body resonator detuning (the maximum level difference between resonance and detuning) can be undertaken using this series resonant circuit when the switch is opened.

The P-I-N diodes 21a and 21b inhibit or block as long as the terminals C and D are not supplied with a direct current. The λ/4 line 20 is thus open, so that the body resonator 9 is detuned. During the transmission mode of the body resonator 9, the terminals C and D are charged with direct current, so that the P-I-N diodes 21a and 21b become conductive. The λ/4 line 20 is thus shorted via the capacitors 21c and 21d. The current is thus divided between the two respective branches containing the two P-I-N diodes 21a and 21b, because an individual P-I-N diode does not exhibit the required loading ability in practice. In addition, the short circuit at the end of the λ/4 line 20 is improved.

The inductances 21k 21l, 21h and the capacitor 21g prevent the radio-frequency from being transmitted to the direct current lines (control lines).

Figure 4:
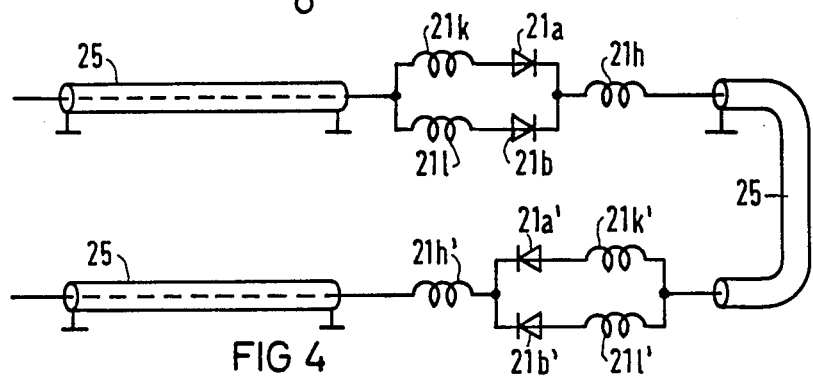
FIG. 4 is a schematic diagram of a further embodiment for two switches.

As described in the aforementioned German OS No 31 33 432, at least two pairs of rods for the body resonator 9 are required for circularly polarized fields. A λ/4 line 20 having a switch 21 is thus provided for each conductor pair. The switches 21 can then be connected in series in terms of direct current. A circuit for two such switches effective for direct current is shown in FIG. 4. Diodes 21a and 21b are connected with the same polarity in parallel, and are connected in series in terms of direct current via a shielded line 25. The same is true for diodes 21a' and 21b'. Inductances 21h, 21k and 21l and inductances 21h', 21k' and 21l' prevent the connection in direct current terms from having an influence on the radio frequency.

Figure 5:
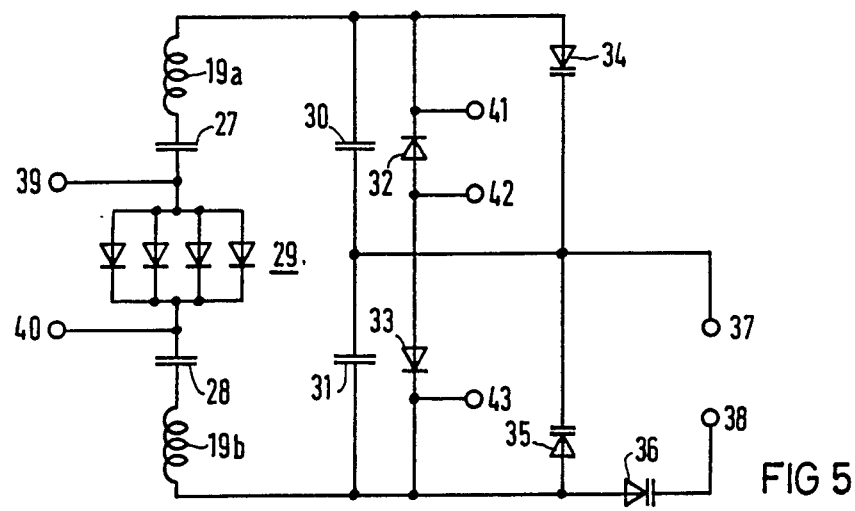
FIG. 5 is a circuit diagram of a circuit for interrupting the resonant circuit of the surface coil during excitation of the examination subject using the body resonator.

An exemplary embodiment of a circuit for interrupting the resonant circuit of the surface coil 19, given excitation of the examination subject using the body resonator 9, is shown in FIG. 5. The surface coil 19 is shown divided into identical coils 19a and 19b which are connected to each other via the series circuit of a capacitor 27, a parallel circuit 29 consisting of four P-I-N diodes, and a further capacitor 28. A series connection of two capacitors 30 and 31 is connected in parallel with the surface coil 19. A series circuit consisting of two protective diodes 32 and 33 is also connected in parallel with the surface coil 19, as is another series circuit consisting of two tuning diodes 34 and 35. The signal voltage is tapped at the junction of the two capacitors 30 and 31 via a terminal 37 and at the junction of the surface coil 19 with the capacitor 31 via a matching diode 36 and a terminal 38. The resonant frequency of the surface coil 19 is matched to the signal frequency with the tuning diodes 34 and 35. A matching of the arrangement to the characteristic impedance of the connecting line is achieved with the matching diode 36. For that purpose, the tuning diodes 34 and 35 and the matching diode 36 are charged with a control dc voltage, which is not shown for clarity.

During the transmission mode, i.e., during excitation of the examination subject with the body resonator 9, the resonant circuit of the surface coil 19 is separated by charging the parallel circuit 29 consisting of the P-I-N diodes with an inhibiting dc voltage via the terminals 39 and 40. This prevents the generation of an induction current, which would influence the excitation field. The separation of the resonant circuit is undertaken at the location having the lowest impedance in terms of radio-frequency, so that the parallel circuit 29 of P-I-N diodes is supplied with a voltage which barely drives those diodes to a blocking state. During the transmission mode, the tuning diodes 34 and 35 are protected against over-voltages by the oppositely polarized protective diodes 32 and 33, which are operated in tandem.

During reception, the parallel circuit 29 of P-I-N diodes is no longer charged with an inhibiting voltage, i.e., those diodes are operated together and thus represent a short-circuit. The protective diodes 32 and 33 are charged with an inhibiting dc voltage which is supplied at terminals 41, 42 and 43, so that the protective diodes are cut out of the circuit. The surface coil is thus in resonance with the nuclear magnetic resonance signal.

Although modifications and changes may be suggested by those skilled in the art it is the intention of the inventors to embody within the patent warranted herein all changes and modifications as reasonably and properly come within the scope of their contribution to the art.

We claim as our invention:

1. In a nuclear magnetic resonance apparatus for identifying spectra or images of an examination subject disposed in a fundamental magnetic field and a plurality of gradient magnetic fields, said apparatus having antenna means with a high impedance for irradiating said examination subject with a sequence of radio-frequency pulses having a wave-length $\lambda$, said pulses inducing nuclear magnetic resonance signals in said examination subject, and having a coil means for acquiring said nuclear magnetic resonance signals from said examination subject, the improvement comprising:
   means for decoupling said antenna means and said coil means from each other including at least one coaxial line having a first end connected to said antenna means and having a second end connected to a $\lambda/4$ line, said at least one coaxial line having a transmission characteristic which transforms the high impedance of said antenna means to a lower level, and switching means connected at a free end of said $\lambda/4$ line for short-circuiting said $\lambda/4$ line during emission of said radio-frequency pulses by said antenna means and opening said $\lambda/4$ line during reception of said nuclear magnetic resonance signals by said coil means.

2. The improvement of claim 1, wherein said switching means includes at least one diode.

3. The improvement of claim 2, wherein said diode is a P-I-N diode.

4. The improvement of claim 1, wherein said switching means includes at least two P-I-N diodes connected in parallel with the same polarity to said free end of said $\lambda/4$ line.

5. The improvement of claim 1, further comprising a resonant circuit connected to said coil means, said resonant circuit including switching means for detuning said resonant circuit, said switching means in said resonant circuit being open during emission of said radio-frequency pulses by said antenna means.

6. The improvement of claim 5, wherein said switching means in said resonance circuit comprises a plurality of P-I-N diodes connected in parallel with the same polarity.

7. The improvement of claim 5, wherein said coil means comprises two coil sections, and wherein said switching means in said resonant circuit is connected between said coil sections.

8. The improvement of claim 1, wherein the number of said coaxial lines is at least two, and wherein said $\lambda/4$ line is connected to said antenna means through two of said coaxial lines.

9. The improvement of claim 8, wherein said switching means includes two switches respectively connected to said coaxial lines.

10. The improvement of claim 8, wherein said two coaxial lines are connected to each other by a dc connection.

11. In a nuclear magnetic resonance apparatus for identifying spectra or images of an examination subject disposed in a fundamental magnetic field and a plurality of gradient magnetic fields, said apparatus having a whole-body antenna with high impedance for irradiating said examination subject with a sequence of radio-frequency pulses having a wavelength $\lambda$ for inducing nuclear magnetic resonance signals in said examination subject, and a surface coil for acquiring the resulting nuclear magnetic resonance signals from said examination subject, the improvement of means for decoupling said whole-body antenna and said surface coil from each other comprising:
   two coaxial lines each having a first end connected to said whole-body antenna, each coaxial line having a transmission characteristic selected for transforming the high impedance of said whole-body antenna to a lower level, each coaxial line having a second end;

a λ/4 line connected to each of said second ends of said coaxial lines and having a free end; and switching means connected to said free end of said λ/4 line for shorting said λ/4 line during transmission of radio-frequency pulses with said whole-body antenna and for opening said λ/4 line during reception of said nuclear magnetic resonance signals by said surface coil.

12. The improvement of claim 11, wherein said switching means includes at least one P-I-N diode.

* * * * *